United States Patent [19]
Kubo et al.

[11] Patent Number: 5,929,713
[45] Date of Patent: Jul. 27, 1999

[54] OSCILLATING CIRCUITRY BUILT IN INTEGRATED CIRCUITRY

[75] Inventors: Kenji Kubo; Hideyuki Takaoka, both of Hyogo, Japan

[73] Assignees: Mitsubishi Electric System LSI Design Corporation, Hyogo; Mitsubishi Denki Kabushiki Kaisha, Tokyo, both of Japan

[21] Appl. No.: 09/024,217

[22] Filed: Feb. 17, 1998

[30] Foreign Application Priority Data

Sep. 24, 1997 [JP] Japan .................................. 9-258604

[51] Int. Cl.⁶ ...................................................... H03B 5/00
[52] U.S. Cl. ............................ 331/49; 331/173; 331/175; 327/298
[58] Field of Search .................................. 331/49, 57, 143, 331/158, 173, 175; 327/142, 144, 151, 160, 291, 294, 298

[56] References Cited

U.S. PATENT DOCUMENTS 5,754,081  5/1998  Kuroiwa et al. .......................... 331/49

FOREIGN PATENT DOCUMENTS

| | | |
|---|---|---|
| 2-22716 | 1/1990 | Japan . |
| 3-6718 | 1/1991 | Japan . |
| 4-251312 | 9/1992 | Japan . |
| 6-231280 | 8/1994 | Japan . |
| 6-260836 | 9/1994 | Japan . |

OTHER PUBLICATIONS

"8–Bit CMOS EPROM Microcontroller with A/D Converter," Microchip Technology Incorporated Data Book 1993, cover page, pp. 23–27.

*Primary Examiner*—David Mis
*Attorney, Agent, or Firm*—Burns, Doane, Swecker & Mathis, L.L.P.

[57] ABSTRACT

Oscillating circuitry built in integrated circuitry (1) comprises a ring oscillator (31) for generating a first clock, an external oscillator (40) capable of generating a second clock in either one of two oscillating modes which is determined according to an external circuit (12 and 13, or 6 through 8) connected to terminals (2 and 3) thereof, and an internal clock selection circuit (41) which delivers the first clock as an internal clock to the integrated circuitry (1) just after the integrated circuitry (1) is activated or reset, stops the delivery of the first clock and simultaneously furnishes a signal held at a logic high level as the internal clock in response to a control signal for instructing a selection of the second clock, and then determines whether or not the external oscillator (40) is generating the second clock properly, and which furnishes the second clock as the internal clock when it determines that the external oscillator (40) is generating the second clock properly.

8 Claims, 6 Drawing Sheets

OSCILLATING CIRCUITRY BUILT IN INTEGRATED CIRCUITRY

BACKGROUND OF THE INVENTION

1. Field of the Invention

The present invention relates to oscillating circuitry built in integrated circuitry, for generating and furnishing an internal clock to other components disposed within the integrated circuitry and, more particularly, to built-in oscillating circuitry with multiple oscillating modes which can oscillate in solid oscillating mode by means of an external solid oscillator such as a ceramic resonator or a crystal resonator, and oscillate in RC oscillating mode by means of an external RC circuit comprised of a resistor and a capacitor, so as to generate an internal clock signal.

2. Description of the Prior Art

Referring now to FIG. 6, there is illustrated a schematic circuit diagram showing the structure of a prior art oscillator built in integrated circuitry. The prior art oscillator can oscillate in solid oscillating mode. In FIG. 6, reference numeral 1 denotes integrated circuitry, 2 and 3 denote external terminals, 4 denotes an inverter connected between the external terminals 2 and 3, 5 denotes a feedback resistor connected, in parallel with the inverter 4, to the external terminals 2 and 3, 6 denotes an external ceramic resonator connected between the external terminals 2 and 3, and 7 and 8 denote capacitors connected to the external terminals 2 and 3, respectively.

In operation, when a voltage is applied to the oscillator, the ceramic resonator 6 starts to oscillate and a small AC voltage which corresponds to the amount of oscillation is induced across both ends of the ceramic resonator 6. A small change in voltage having a frequency which corresponds to the capacitances of the capacitors 7 and 8 is then applied between the external terminals 2 and 3. As a result, the inverter 4 generates an AC voltage V0 which is synchronized with the small change in voltage applied to the external terminal 2 and the AC voltage is furnished, as the internal clock, to other components disposed within the integrated circuitry 1.

Referring now to FIG. 7, there is illustrated a schematic circuit diagram showing the structure of another prior art oscillator built in integrated circuitry. The prior art oscillator can oscillate in RC oscillating mode. In FIG. 7, reference numeral 1 denotes integrated circuitry, 9 denotes an external terminal, 10 and 11 denote reference voltage generating resistors for generating a reference voltage, 12 denotes an external resistor connected to the external terminal 9, 13 denotes an external capacitor connected to the external terminal 9, 14 denotes a comparator for comparing a voltage at the external terminal 9 with the reference voltage, 15 denotes an N-channel MOS transistor or NMOS which can be turned on or off according to a comparison result from the comparator 14 so as to attract a current from the external terminal 9, 16 denotes a delay circuit disposed between the output of the comparator 14 and the gate of the NMOS 15, and 17 denotes an inverter for inverting the voltage at the external terminal 9 so as to furnish the inverted voltage.

In operation, when a voltage is applied to the oscillator, the voltage at the external terminal 9 starts to increase with a time constant which corresponds to the impedance of the RC circuit comprised of the external resistor 12 and the external capacitor 13. When the voltage at the external terminal 9 exceeds the reference voltage generated by the reference voltage generating resistors 10 and 11, the output level of the comparator 14 is inverted. Furthermore, after a delay defined by the delay circuit 16, the voltage applied to the gate of the NMOS 15 is inverted. A current then starts to flow from the source of the NMOS 15 to the drain of the NMOS 15. As a result, a charge stored on the external capacitor 13 is attracted by the NMOS 15 and hence the voltage at the external terminal 9 is decreased. After that, when the voltage at the external terminal 9 becomes lower than the reference voltage, the output level of the comparator 14 is inverted again, that is, it returns to the original level, and the NMOS 15 is therefore turned off. As a result, the external capacitor 13 starts to become charged. In this manner, the voltage at the external terminal 9 is varied at intervals determined by the delay time defined by the delay circuit 16 and the response speed of the RC circuit comprised of the external resistor 12 and the external capacitor 13. The inverter 17 inverts and furnishes the varying voltage at the external terminal 9 as the internal clock.

It is to be noted from comparison between the two prior art oscillators that while the former solid-type conventional oscillator is comparatively high in cost as compared with the latter conventional CR-type oscillator, the former solid-type oscillator can generate a clock with a higher degree of accuracy.

A problem with such the prior art built-in oscillators which are so constructed as mentioned above is that since providers need to prepare a variety of integrated circuits having the same function the number of which is equal to a variety of built-in oscillators, it is difficult for providers to expect the economies of scale in manufacturing, and users have to select one from the variety of integrated circuits by not only doing a side-by-side function evaluation, but also considering which oscillating mode is suitable for the uses of a desired integrated circuit.

As recent years have seen significant advances in the area of integration of integrated circuitry, oscillating circuitry built in integrated circuitry which can oscillate in either one of solid oscillating mode and RC oscillating mode as disclosed in Japanese Patent Application Laying Open (KOKAI) No. 6-260836 has been proposed in order to overcome the above problem. Referring next to FIG. 8, there is illustrated a schematic circuit diagram showing the structure of the built-in oscillating circuitry. In the figure, reference numeral 26 denotes a first oscillator which can oscillate in either one of solid oscillating mode and RC oscillating mode, 27 denotes a second oscillator, 28 denotes a clock selection circuit for selecting one from a clock from the first oscillator 26 and another clock from the second oscillator 27 so as to furnish the selected clock as an internal clock, 18 and 19 denote external terminals connected to the first oscillator 26, 20 and 21 denote buffers each having a function of controlling its output, 22 denotes an inverter, 23 denotes a capacitor, 24 denotes a switch for changing the connection of the terminal 18 from the buffer 21 to the buffer 20 and the capacitor 23, and vice versa, 25 denotes another switch for changing the connection of the terminal 19 from the buffer 21 to the inverters 22, and vice versa, and 29 and 30 denote external terminals connected to the second oscillator 27.

First, it is assumed that an external resistor is connected to the external terminals 18 and 19 of the first oscillator 26, and the switch 24 is set to connect the terminal 18 with the buffer 20 and the capacitor 23 and the switch 25 is set to connect the terminal 19 with the inverters 22. In this case, when, for example, the output level of the inverter 22 having it output connected to the switch 25 makes a LOW to HIGH transition, a current flows through the capacitor 23 and the external resistor not shown and, after a delay which corresponds to the time constant of the RC circuit, the voltage at the external terminal 18 goes high. As a result, the output of the inverter 22 having it output connected to the switch 25 returns to a low logic level after the expiration of a predetermined time interval.

Next, it is assumed that a feedback resistor and a ceramic resonator are connected between the external terminals 18 and 19 of the first oscillator and two capacitors are connected to the two external terminals 18 and 19, respectively, and the switch 24 is set to connect the terminal 18 with an input of the buffer 21 and the switch 25 is set to connect the terminal 19 with the output of the buffer 21. In this case, the ceramic resonator and the two capacitors not shown generates a change in voltage having a given frequency. In response to the change in voltage applied to the external terminal 18, the buffer 21 generates a clock signal and then the feedback resistor not shown shapes the waveform of the clock signal.

The second oscillator 27 is so constructed as to oscillate and generate a clock in one oscillating mode. After the prior art oscillating circuitry releases from its reset state, the clock selecting switch 28 is controlled so that the clock from the second oscillator 27 is furnished as the internal clock.

As previously mentioned, while the conventional oscillating circuitry built in integrated circuitry as shown in FIG. 8 can oscillate in either one of the two oscillating modes, the oscillating circuitry suffers from a drawback that since the rising and falling timing of edges of the clock from the first oscillator 26 is not coincident with that of edges of the clock from the second oscillator 27, a clock having a frequency greater than those of the clocks from the first and second oscillators 26 and 27 can be generated when switching the selection between the clocks and a so-called spike noise can be generated. If such a high-frequency clock is delivered to the other components of the integrated circuitry, a sufficient data setup time cannot be provided, and hence latching operations are made unstable and malfunctions occur in the other components within the integrated circuitry. Therefore, even if the integrated circuitry equipped with the prior art oscillating circuitry is reset, the restoration of the integrated circuitry cannot be ensured with the integrated circuitry held in its reset state.

In addition, the prior art oscillating circuitry needs the different two pairs of external terminals 18, 19 and 29, 30 for the first and second oscillators 26 and 27. This causes an increase in the number of pins needed by the integrated circuitry.

SUMMARY OF THE INVENTION

The present invention is made to overcome the above-mentioned problems. It is therefore an object of the present invention to provide oscillating circuitry built in integrated circuitry, capable of oscillating in either one of two or more oscillating modes by means of an external oscillator and an internal oscillator, and generating an internal clock with stability even when carrying out a process for changing the selection of the internal clock from a clock from the internal oscillator to another clock from the external oscillator, without an increase in the number of pins needed by the integrated circuitry, thereby ensuring the restoration of the integrated circuitry after the integrated circuitry is reset.

In accordance with the present invention, there is provided oscillating circuitry which can be built in integrated circuitry and which can oscillate in either one of two or more oscillating modes, comprising: an internal oscillator for generating a first clock; an external oscillator capable of generating a second clock in either one of the two or more oscillating modes which is determined according to an external circuit connected to terminals thereof; and an internal clock selection circuit which delivers the first clock as an internal clock to the integrated circuitry just after the integrated circuitry is activated or reset, stops the delivery of the first clock and simultaneously furnishes a signal held at a logic high level as the internal clock in response to a control signal for instructing a selection of the second clock, and then determines whether or not the external oscillator is generating the second clock properly, and which furnishes the second clock as the internal clock when it determines that the external oscillator is generating the second clock properly.

In accordance with a preferred embodiment of the present invention, the internal oscillator is a ring oscillator. Preferably, the internal clock selection circuit further includes a register into which new contents from outside can be rewritten by a writing operation, and which can generate the control signal for instructing the selection of the second signal according to the new contents. The internal clock selection circuit can include a counter, responsive to the control signal for instructing the selection of the second clock, for counting the number of pulses included in the second clock applied thereto. Furthermore, when the counter reaches a predetermined value which is greater than or equal to 1, the internal clock selection circuit determines that the external oscillator is generating the second clock properly and then furnishes the second clock as the internal clock.

In accordance with another preferred embodiment of the present invention, the internal clock selection circuit further determines whether or not the external oscillator is generating the second clock properly, and then generates the control signal for instructing the selection of the second clock when it determines that the external oscillator is generating the second clock properly. In order to determine whether or not the external oscillator is generating the second clock properly, it is preferable that the determining circuit includes a counter for counting the number of pulses included in the second clock applied thereto, and an equality circuit for generating the control signal for instructing the selection of the second clock when the counter reaches a predetermined value which is greater than or equal to 1.

In accordance with another preferred embodiment of the present invention, the internal clock selection circuit further comprises a circuit for determining whether or not the external oscillator is generating the second clock properly, and for disabling the selection of the second clock when it determines that the external oscillator is not generating the second clock properly. Preferably, the disabling circuit includes a counter for counting the number of pulses included in the second clock applied thereto and for furnishing an overflow signal when the counter overflows. Furthermore, the internal clock selection circuit further includes a register into which new contents from outside can be rewritten by a writing operation, and which can generate the control signal for instructing the selection of the second signal according to the new contents only if it receives the overflow signal from the counter.

Further objects and advantages of the present invention will be apparent from the following description of the preferred embodiments of the invention as illustrated in the accompanying drawings.

BRIEF DESCRIPTION OF THE DRAWINGS

FIG. 2 is a schematic circuit diagram showing the structure of the main body of an internal clock selection circuit of the oscillating circuitry of FIG. 1a;

DETAILED DESCRIPTION OF THE PREFERRED EMBODIMENT

First Embodiment

Figure 1B:
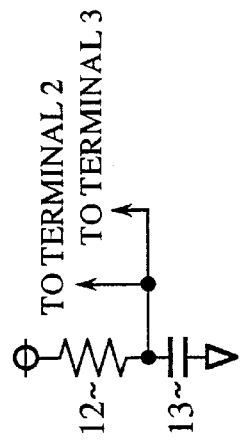
FIG. 1b is a schematic circuit diagram showing external components for use in RC oscillating mode which can be connected to two external terminals of an external oscillator of the oscillating circuitry of FIG. 1a when causing the external oscillator to oscillate in RC oscillating mode.
Figure 1C:
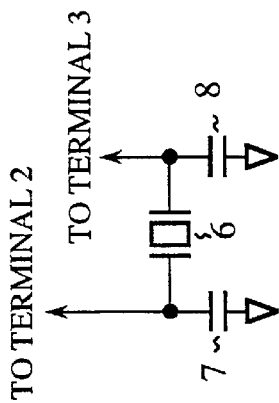
FIG. 1c is a schematic circuit diagram showing external components for use in solid oscillating mode which can be connected to the two external terminals of the external oscillator of the oscillating circuitry of FIG. 1a when causing the external oscillator to oscillate in solid oscillating mode.
Figure 1A:
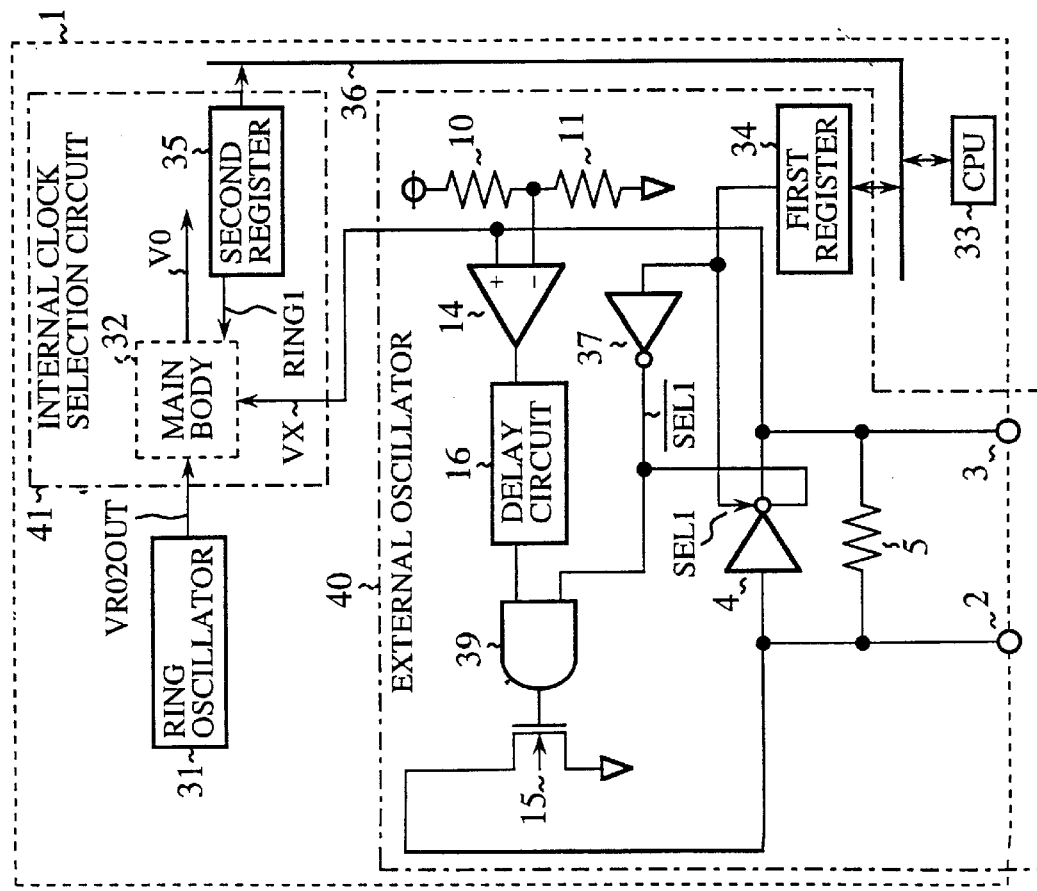
FIG. 1a is a schematic circuit diagram showing the structure of oscillating circuitry built in integrated circuitry which can oscillate in either one of multiple oscillating modes, according to a first embodiment of the present invention.

Referring next to FIG. 1a, there is illustrated a schematic circuit diagram of oscillating circuitry built in integrated circuitry which can oscillate in either one of a plurality of oscillating modes, according to a first embodiment of the present invention. In the figure, reference numeral 1 denotes the integrated circuitry, 33 denotes a central processing unit (CPU) disposed within the integrated circuitry 1, and 31 denotes a ring oscillator or internal oscillator built in the integrated circuitry 1 and provided with a plurality of sets of an inverter and a capacitor, for generating a first clock VR020UT. The plurality of sets are connected in series with each other. The output of the ring oscillator 31 is fed back into the input thereof. Furthermore, reference numeral 40 denotes an external oscillator which can oscillate in either one of solid oscillating mode and RC oscillating mode so as to generate a second clock VX. The external oscillator 40 includes two external terminals 2 and 3. Reference numeral 41 denotes an internal clock selection circuit for selecting either the first clock VR020UT furnished by the ring oscillator 31 or the second clock VX furnished by the external oscillator 40 so as to furnish the selected clock as an internal clock, and 36 denotes a bus for connecting the CPU 33 with the external oscillator 40, the clock selecting circuit 41, and other components (not shown) disposed within the integrated circuitry 1.

In addition, reference numeral 4 denotes an inverter connected between the two external terminals 2 and 3 of the external oscillator 40, 5 denotes a feedback resistor connected in parallel with the inverter 4, 10 and 11 denote reference voltage generating resistors for generating a reference voltage, 14 denotes a comparator for comparing a voltage at the external terminal 3 with the reference voltage, 15 denotes an N-channel MOS transistor or NMOS which can be turned on or off according to a comparison result from the comparator 14 so as to attract a current from the external terminal 2, 16 denotes a delay circuit disposed between the comparator 14 and the NMOS 15, 34 denotes a first register which can deliver a select signal SEL1 having a value which corresponds to a data which has been written, by way of the bus 36, thereinto by the CPU 33, 37 denotes an inverter for inverting the select signal SEL1, and 39 denotes an AND gate capable of preventing the output of the inverter 14 delayed by the delay circuit 16 from reaching the NMOS 15 according to the inverted select signal.

Furthermore, 32 denotes a main body of the internal clock selection circuit 41 for selecting either the first clock VR020UT applied thereto or the second clock VX applied thereto and for furnishing the selected first or second clock as the internal clock, and 35 denotes a second register which can deliver a control signal RING1 for causing the main body 32 to select either the first clock VR020UT or the second clock VX according to a data which has been written, by way of the bus 36, thereinto by the CPU 33.

Referring next to FIG. 1b, there is illustrated a schematic circuit diagram showing external components for use in RC oscillating mode which are connected to the two external terminals 2 and 3 of the external oscillator 40 when the external oscillator 40 oscillates in RC oscillating mode. In the figure, reference numeral 12 denotes an external resistor connected in common with the two external terminals 2 and 3, and 13 denotes a capacitor connected in common with the two external terminals 2 and 3.

Referring next to FIG. 1c, there is illustrated a schematic circuit diagram showing external components for use in solid oscillating mode which are connected to the two external terminals 2 and 3 of the external oscillator 40 when the external oscillator 40 oscillates in solid oscillating mode. In the figure, reference numeral 6 denotes a ceramic resonator connected between the two external terminals 2 and 3, and 7 and 8 denote capacitors connected with the two external terminals 2 and 3, respectively.

Figure 2:
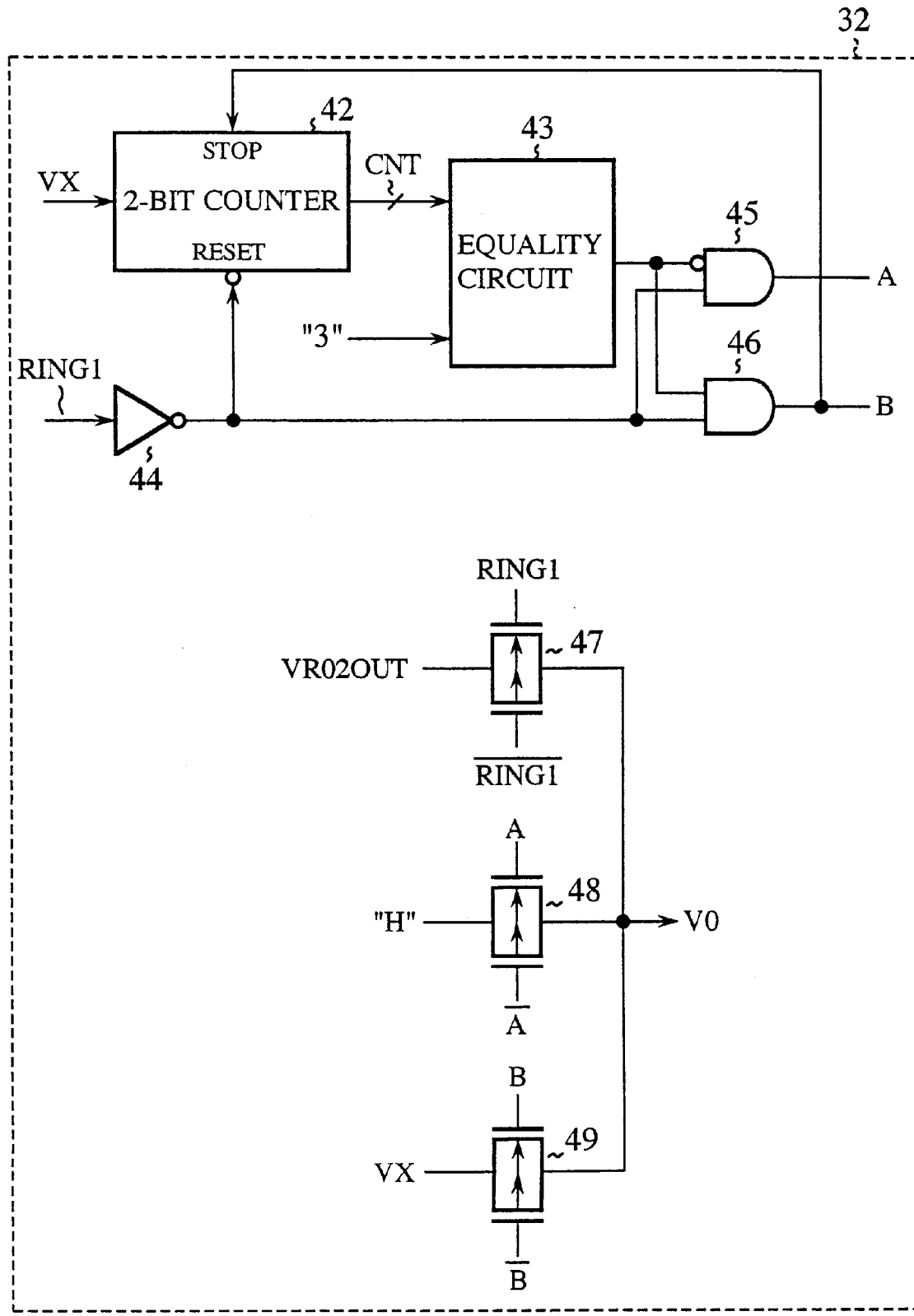

Referring next to FIG. 2, there is illustrated a schematic circuit diagram showing the detailed structure of the main body 32 of the internal clock selection circuit 41. In the figure, reference numeral 42 denotes a 2-bit counter which can count the number of pulses included in the second clock VX furnished by the external oscillator 40, 43 denotes an equality circuit which can furnish an equality signal when the 2-bit counter 42 reaches 3, 44 denotes an inverter which can receive and invert the control signal RING1 from the second register 35, and then deliver the inverted control signal to the reset terminal of the 2-bit counter 42, 45 denotes a two-input AND gate which can implement the logical AND operation on the inversion of the equality signal from the equality circuit 43 and the inverted control signal from the inverter 44 so as to generate a signal A that is asserted high over a period of time during which the equality signal and the inverted control signal don't have the same logic level as each other, after the inverted control signal goes high, 46 denotes another two-input AND gate which can implement the logical AND operation on the equality signal from the equality circuit 43 and the inverted control signal from the inverter 44 so as to generate an external clock signal B that is asserted high over a period of time during which the equality signal and the inverted control signal have the same logic level, after the inverted control signal goes high, 47 denotes a first switch which can furnish the first clock VR020UT applied thereto from the ring oscillator 31 as the internal clock V0 when the control signal RING1 has a logic high level, 48 denotes a second switch which can furnish a signal H held at a logic high level applied thereto as the internal clock V0 when the signal A from the AND gate 45 has a logic high level, and 49 denotes a third switch which can furnish the second clock VX applied thereto from the external oscillator 40 as the internal clock V0 when the signal B from the AND gate 46 has a logic high level. These switches are constructed of CMOS.

First, a description will be made as to the operation of the oscillating circuitry when the external components used in RC oscillating mode as shown in FIG. 1b are connected to the external terminals 2 and 3. When the integrated circuitry 1 is activated by turning its power on or the integrated circuitry 1 is reset, the contents in the first and second registers 34 and 35 are reset. The second register 35 then furnishes the control signal RING1 at a logic high level so as to cause the main body 32 of the internal clock selection circuit to select the first clock VR020UT from the ring oscillator 31. At the same time when the power is turned on to activate the integrated circuitry 1, the ring oscillator 31 is activated and furnishes the first clock VR020UT including a repetitive series of pulses with a predetermined repetition rate to the main body 32 of the internal clock selection circuit 41. As a result, the first switch 47 is turned on, and therefore the main body 31 of the internal clock selection circuit 41 furnishes the first clock VR020UT from the ring oscillator 31 as the internal clock V0. A start-up process is then carried out for the integrated circuitry 1 according to the first clock VR020UT from the internal clock selection circuit 41. In this case, since the inverted control signal furnished by the inverter 44 is held at a low logic level, neither the second switch 48 nor the third switch 49 furnishes a clock signal.

Figure 3A:
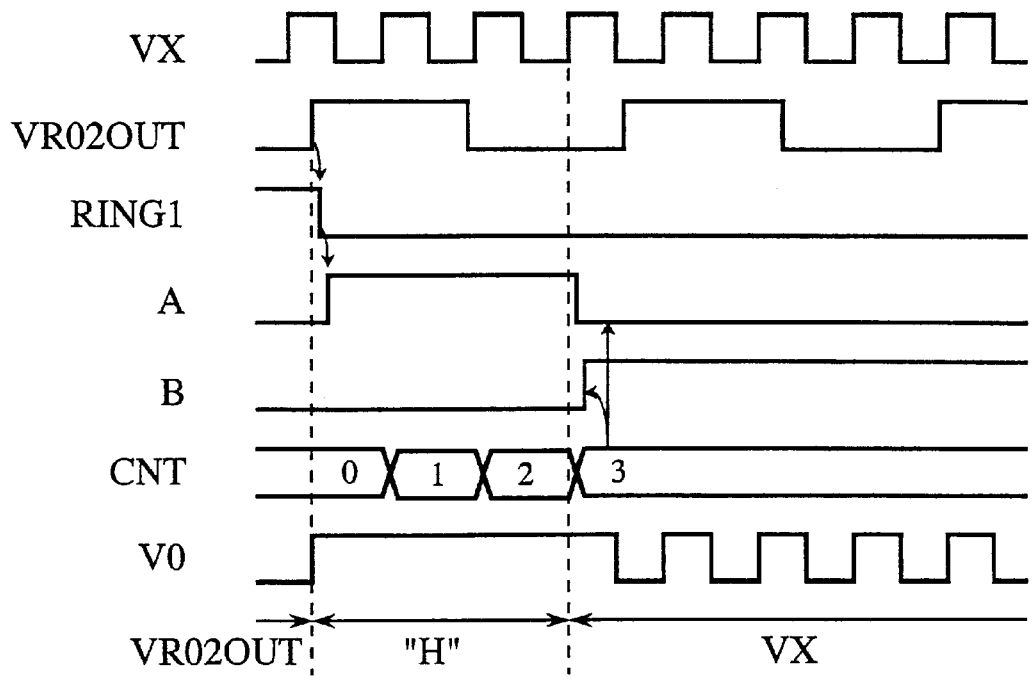
FIGS. 3a is a timing chart showing an example of the operation of the oscillating circuitry of the first embodiment when a clock switching operation is performed.
Figure 3B:
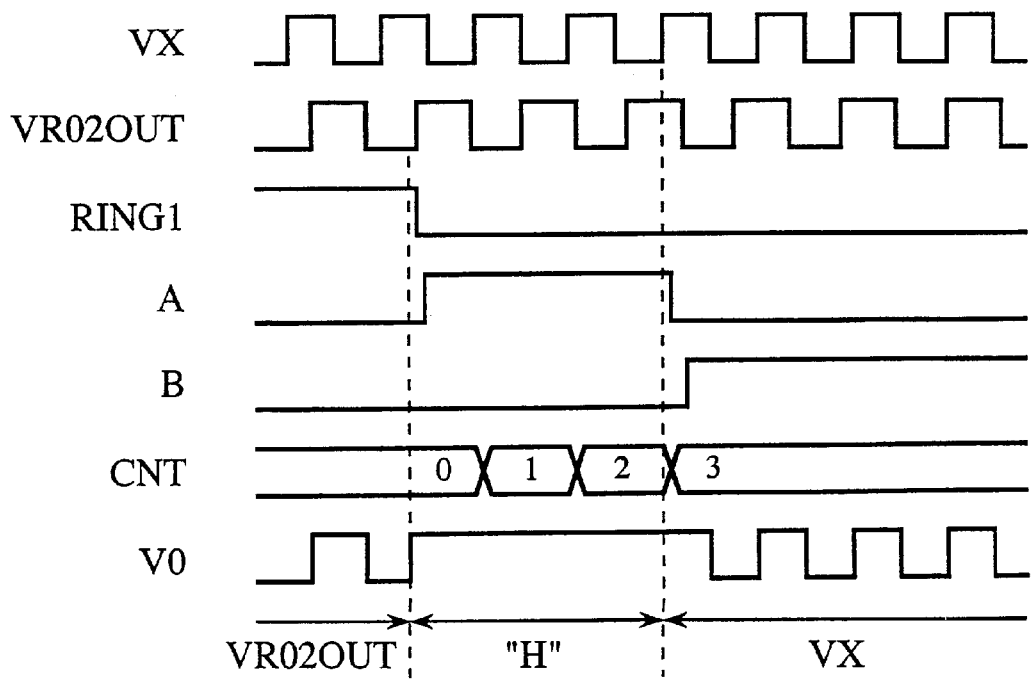
FIGS. 3b is a timing chart showing another example of the operation of the oscillating circuitry of the first embodiment when a clock switching operation is performed.

Referring next to FIGS. 3a and 3b, there are illustrated timing charts each showing an example of the operation of the oscillating circuitry of the first embodiment when changing or switching the current selection of the internal clock from the first clock VR020UT to the second clock VX, as will be described below. FIG. 3a shows an example of the operation of the oscillating circuitry when the repetition rate of the second clock VX is set to be much greater than that of the first clock VR020UT. FIG. 3b shows an example of the operation of the oscillating circuitry when the repetition rate of the second clock VX is set to be nearly equal to that of the first clock VR020UT. Hereafter, a description will be made at to the switching operation with reference to FIGS. 3a and 3b.

After the internal clock selection circuit 41 starts to furnish the first clock VR020UT from the ring oscillator 31, the CPU 33 can write predetermined data into the first and second registers 34 and 35 according to a start-up program. To be more specific, the CPU 33 can write a predetermined data into the first register 34 such that the first register 34 furnishes the select signal SELL at a low logic level, and further writes a predetermined data into the second register 35 such that the second register 35 furnishes the control signal RING1 at a low logic level. As a result, the control signal RING1 makes a HIGH to LOW transition, as shown in FIGS. 3a and 3b. In response to the control signal RING1 at a logic low level, the main body 32 of the internal clock selection circuit 41 stops the delivery of the first clock VR020UT by turning off the first switch 47, and then furnishes a signal H held at a logic high level as the internal clock V0 by turning off the second switch 48. Simultaneously, a loop comprised of the external resistor 12, the external capacitor 13, the inverter 4, the comparator 14, the delay circuit 16, the AND gate 39, and the NMOS 15 is activated, and the external oscillator 40 then furnishes a second clock VX having a repetition rate dependent upon both the time constant of the RC circuit comprised of the external resistor 12 and capacitor 13 and the delay time by the delay circuit 16. The second clock VX is then delivered to the 2-bit counter 42 of the main body 32 of the internal clock selection circuit 41. After the 2-bit counter 42 releases from its reset state in response to the inverted control signal, it starts to count the number of pulses included in the second clock VX applied thereto. The equality circuit 43 determines whether or not the current count value CNT furnished by the 2-bit counter 42 reaches 3. When the current count value CNT reaches 3, the equality circuit 43 causes the equality signal to make a LOW to HIGH transition. In other words, after the 2-bit counter 42 counts three periods of the second clock VX, the equality circuit 43 furnishes the equality signal at a logic high level. In this manner, the equality circuit 43 determines whether or not the external oscillator 40 is generating the second clock VX properly, in cooperation with the 2-bit counter 42. It is therefore apparent that the threshold value of the equality circuit 43 is not limited to 3.

During the interval from the time when the second register 35 furnishes the control signal RING1 at a logic low level until the equality signal makes a LOW to HIGH transition, that is, until the current count value CNT from the 2-bit counter 42 reaches 3, the AND gate 45 furnishes the signal A held at a logic high level and hence the second switch 48 furnishes the signal H held at a logic high level as the internal clock V0, as shown in FIGS. 3a and 3b. After the equality signal goes high, the AND gate 46 generates the signal B at a logic high level and hence the third switch 49 furnishes the second clock VX from the external oscillator 40 as the internal clock V0. The switching operation is thus completed.

Next, a description will be made as to the operation of the oscillating circuitry when the external components used for solid oscillating mode as shown in FIG. 1c are connected to the external terminals 2 and 3. After the integrated circuitry 1 is activated by turning its power on or the integrated circuitry 1 is reset, the oscillating circuitry operates similar to the case where the external components used for RC oscillating mode as shown in FIG. 1b are connected to the external terminals 2 and 3.

After the clock selecting circuit 41 starts to furnish the first clock VR020UT from the ring oscillator 31, the CPU 33 writes predetermined data into the first and second registers 34 and 35 according to a start-up program, like the aforementioned case. To be more specific, the CPU 33 writes a predetermined data into the first register 34 such that the first register 34 furnishes the select signal SELL at a low high level, and further writes a predetermined data into the second register 35 such that the second register 35 furnishes the control signal RING1 at a low logic level. In response to the control signal RING1 at a low logic level, the main body 32 of the internal clock selection circuit 41 stops the delivery of the first clock VR020UT by turning off the first switch 47, and then furnishes a signal H held at a logic high level as the internal clock V0 by turning off the second switch 48. Simultaneously, both the inverter 4 and the feedback resistor 5 are activated according to a change in voltage furnished by the ceramic resonator 6 and the capacitors 7 and 8, so that the external oscillator 40 furnishes the second clock VX having a predetermined repetition rate. After the external oscillator 40 generates the second clock VX, the internal clock selection circuit 41 operates similar to the case where the external components used for RC oscillating mode as shown in FIG. 1b are connected to the external terminals 2 and 3.

As previously explained, the oscillating circuitry according to the first embodiment comprises the internal oscillator 31 which can generate the first clock VR020UT, the external oscillator 40 which can generate the second clock VX in either one of RC oscillating mode and solid oscillating mode according to the type of external components connected to the external terminals 2 and 3 thereof, and the internal clock selection circuit 41 which can deliver the first clock VR020UT as the internal clock V0 to the integrated circuitry 1 just after the integrated circuitry 1 is activated or reset, and change the current selection of the internal clock to the second clock VX in response to the control signal RING1 applied thereto so as to furnish the second clock VX as the internal clock V0 to the integrated circuitry 1. Accordingly, the oscillating circuitry of the first embodiment can generate the internal clock in either one of RC oscillating mode and solid oscillating mode.

While there are provided the two oscillators 31 and 40, all the components of the internal oscillator 31 are integrated into one chip, and the external components used in RC oscillating mode and those used in solid oscillating mode which can be connected to the external oscillator 40 share the use of the pair of external terminals 2 and 3. Therefore, the number of pins of the integrated circuitry 1 is almost the same as that of integrated circuitry including a prior art oscillator. In addition, since the oscillating circuitry of this embodiment employs a ring oscillator comprised of transistors and capacitors as the internal oscillator 31, the size of the exemplary internal oscillator can be reduced largely.

Furthermore, when switching the selection of the internal clock from the first clock VR020UT to the second clock VX, the output clock selection circuit 41 stops the delivery of the first clock and furnishes a signal held at a logic high level as the internal clock, and starts to furnish the second clock at the internal clock after it has recognized that the second clock is being generated properly. Accordingly, even though the first and second clocks are out of phase with each other, neither a clock pulse having a repetition rate higher than those of the first and second clocks nor a spike noise can be generated. This results in ensuring the operation of latch circuits or the like built in the integrated circuitry. Furthermore, the restoration of the integrated circuitry can be ensured after it is reset.

In addition to the provision of the second register 35 within the internal clock selection circuit 41, the internal clock selection circuit 41 is so constructed as to change the current selection of the internal clock to the second clock VX in response to the writing of data to the second register 35 by the CPU 33. Accordingly, by using a software program which can run on the integrated circuitry 1, new contents can be rewritten into the second register 35 so that the second clock VX can be selected as the internal clock. The oscillating circuitry according to the first embodiment thus makes it possible to change the selection of the internal clock to the second clock VX according to the operating status of the integrated circuitry 1 including the oscillating circuitry.

Second Embodiment

Figure 4:
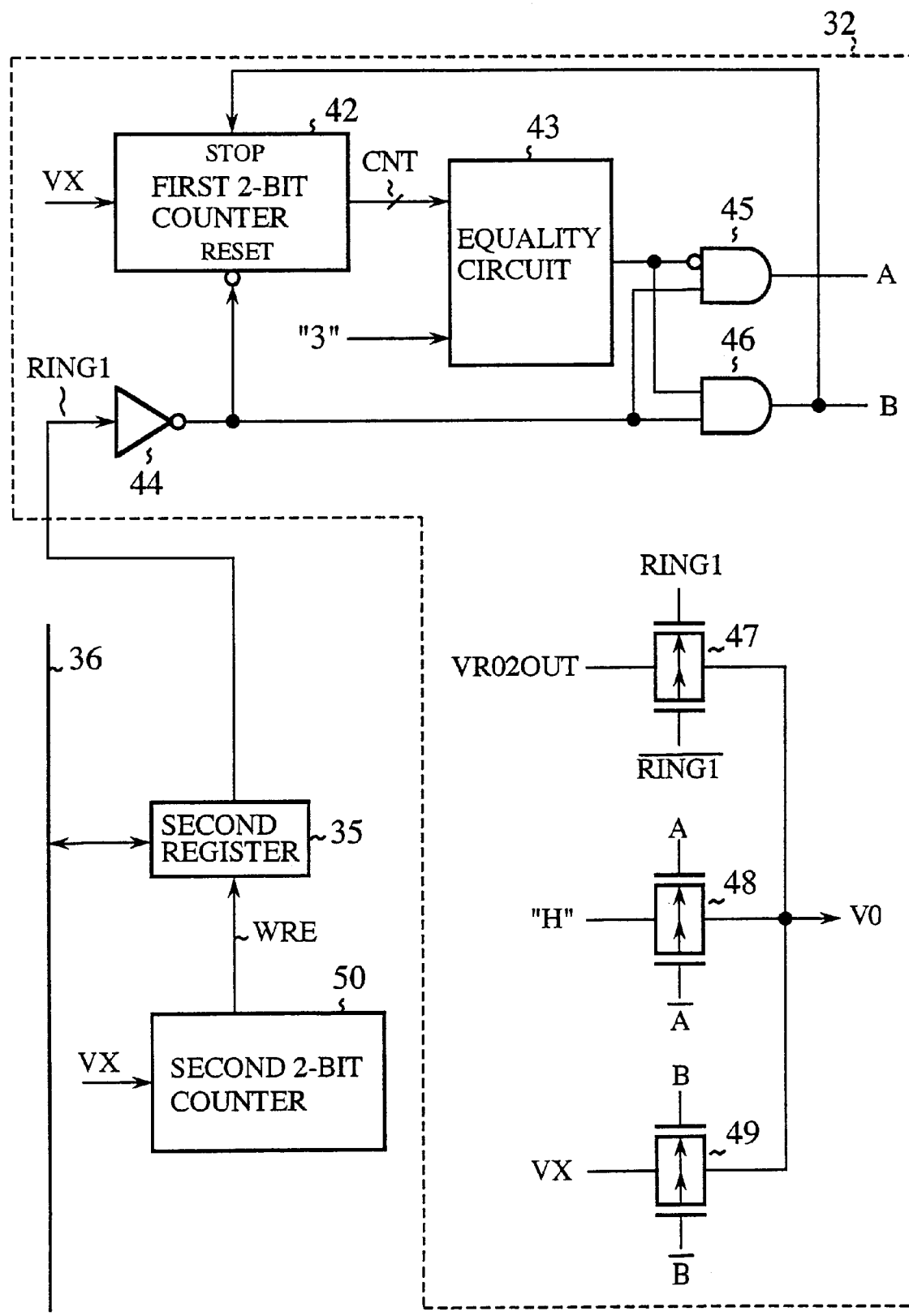
FIG. 4 is a schematic circuit diagram showing the structure of the main body of an internal clock selection circuit of oscillating circuitry according to a second embodiment of the present invention.

Referring next to FIG. 4, there is illustrated a schematic circuit diagram showing the main body 32 of the internal clock selection circuit 41 of oscillating circuitry according to a second embodiment of the present invention. In FIG. 4, the same components as of the integrated circuitry of the first embodiment shown in FIG. 1 are designated by the same reference numerals. Reference numeral 50 denotes a second 2-bit counter for counting the number of clock pulses of the second clock VX from the external oscillator 40 so as to generate an overflow signal WRE when the second 2-bit counter overflows, and 35 denotes a second register which can furnish a control signal RING1 for instructing the internal clock selection circuit 41 to change the selection from the first clock VR020UT to the second clock VX only if the second 2-but counter 50 furnishes the overflow signal WRE. The other structure of the oscillating circuitry of the second embodiment is the same as that of the first embodiment as shown in FIGS. 1 and 2, and therefore only a difference between the first and second embodiments will be explained.

In the first embodiment mentioned above, after the second register 35 furnishes the control signal RING1 at a logic low level, the internal clock selection circuit 41 stops the delivery of the first clock VR020UT and then furnishes a signal H held at a logic high level even if the second clock VX is not being generated properly. On the contrary, the internal clock selection circuit 41 of the second embodiment can disable the selection of the second clock VX when the second clock VX is not being generated properly, as will be explained below.

Like the first embodiment mentioned above, when the integrated circuitry 1 is activated by turning its power on or the integrated circuitry 1 is reset, the internal clock selection circuit 41 furnishes the first clock VR020UT from the ring oscillator 31 as the internal clock V0. After that, the CPU 33 can rewrite new contents into the second register 35 such that the second register 35 can furnish the control signal RING1 at a logic low level. In response to the overflow signal WRE furnished by the second 2-bit counter 50, the second register 35 furnishes the control signal RING1 at a logic low level so as to cause the main body 32 of the internal clock selection circuit 41 to change the selection of the internal clock to the second clock VX. In response to the control signal RING1 at a logic low level, the main body 32 of the internal clock selection circuit 41 stops the delivery of the first clock VR020UT by turning off the first switch 47, and then furnishes a signal H held at a logic high level as the internal clock V0 by turning off the second switch 48. Simultaneously, in response to the control signal RING1, the 2-bit counter 42 starts to count periods of the second clock VX and furnish the current count value CNT to the equality circuit 43. When the 2-bit counter 42 reaches 3, the equality circuit 43 causes the equality signal to make a LOW to HIGH transition. As a result, the selection of the internal clock is changed from the signal H held at a logic high level to the second clock VX. The other operation of the oscillating circuitry of the second embodiment of the present invention is the same as that of the first embodiment, and therefore the description about the other operation will be omitted hereafter.

As previously mentioned, the internal clock selection circuit 41 of the second embodiment is so constructed as to determine whether the external oscillator 40 is generating the second clock VX properly and then disable the selection of the second clock VX when it determines that the external oscillator 40 is not generating the second clock VX properly, by means of the second 2-bit counter 50. Accordingly, the first oscillating circuitry of the second embodiment makes it possible to avoid a possibility that a wrong selection of the second clock is carried out and the signal H held at a high logic level remains being furnished as the internal clock, and hence the integrated circuitry 1 is terminated completely, for reasons that the external oscillator 40 does not start up completely, or there is an occurrence of an emergency such as the disconnection of the external components from the external terminals 2 and 3 of the external oscillator 40. Accordingly, the restoration of the integrated circuitry can be implemented surely after it is reset.

Like the first embodiment, the oscillating circuitry of the second embodiment can oscillate in either one of the two oscillating modes while preventing an increase in the number of pins needed by the integrated circuitry 1 and an increase in the size of the oscillating circuitry. Furthermore, even though the first and second clocks are out of phase with each other, neither a clock pulse having a repetition rate higher than those of the first and second clocks nor a spike noise can be generated. This results in ensuring the operation of latch circuits or the like built in the integrated circuitry. Therefore, the restoration of the integrated circuitry can be ensured after it is reset. In addition, the oscillating circuitry can change the selection of the internal clock to the second clock VX by writing data into the second register 35. The oscillating circuitry according to the first embodiment thus makes it possible to change the current selection to the second clock VX according to the operating status of the integrated circuitry 1 including the oscillating circuitry.

Third Embodiment

Figure 5:
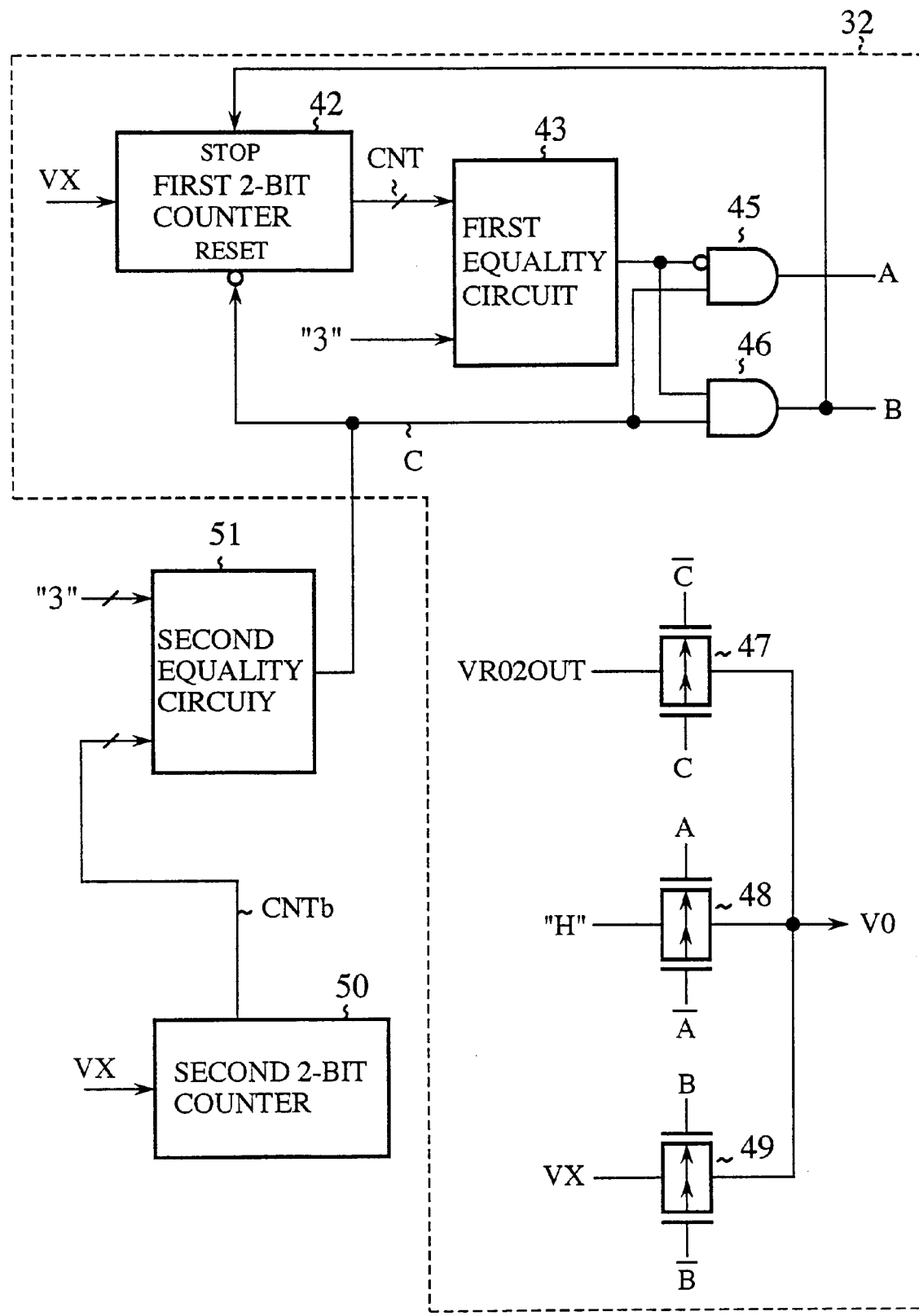
FIG. 5 is a schematic circuit diagram showing the structure of the main body of an internal clock selection circuit of oscillating circuitry according to a third embodiment of the present invention.
Figure 6:
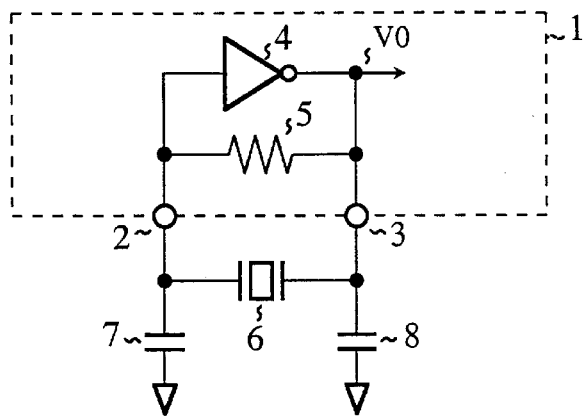
FIG. 6 is a schematic circuit diagram showing the structure of an example of a prior art oscillator built in integrated circuitry.
Figure 7:
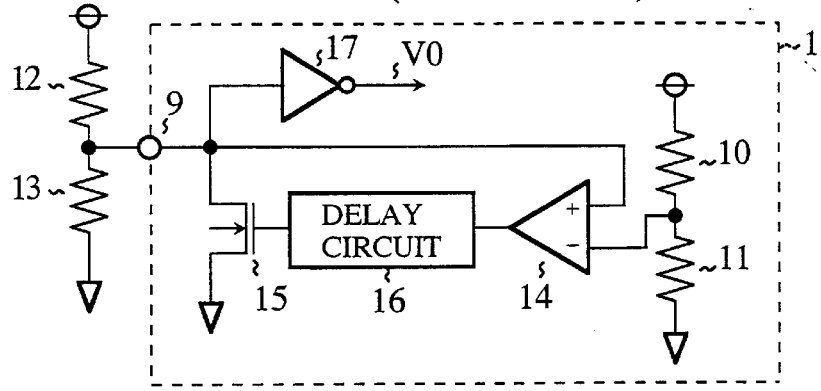
FIG. 7 is a schematic circuit diagram showing the structure of another example of a prior art oscillator built in integrated circuitry.
Figure 8:
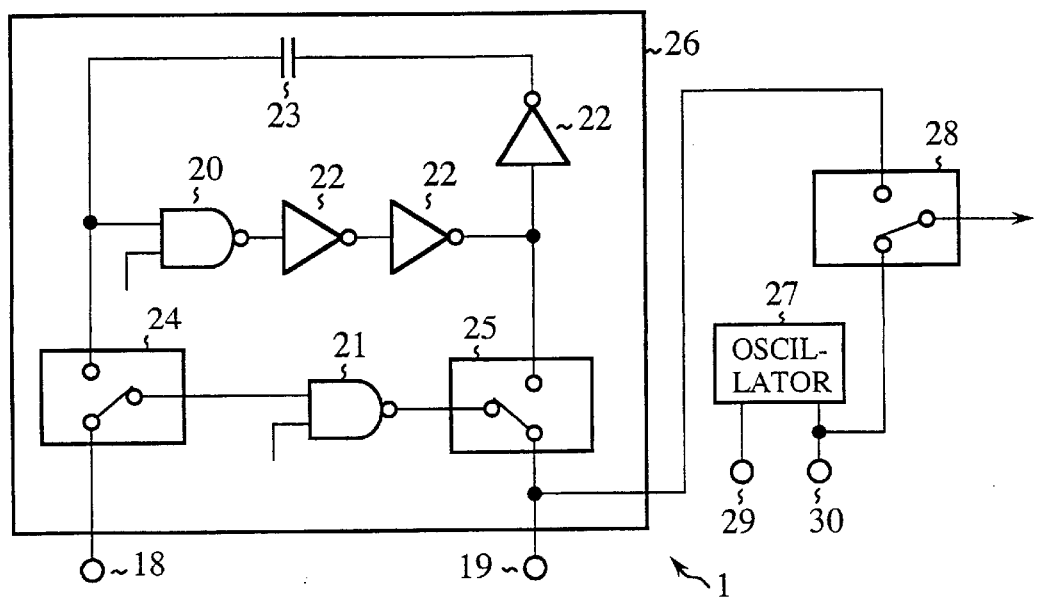
FIG. 8 is a schematic circuit diagram showing the structure of a prior art oscillator built in integrated circuitry which can oscillate in either of two oscillating modes.

Referring next to FIG. 5, there is illustrated a schematic circuit diagram showing the main body 32 of the internal clock selection circuit 41 of oscillating circuitry according to a third embodiment of the present invention. In FIG. 5, the same components as of the integrated circuitry of the second embodiment shown in FIG. 4 are designated by the same reference numerals. Reference numeral 51 denotes a second equality circuit which can automatically furnish a control signal C for instructing the main body 32 of the internal clock selection circuit 41 to change the selection of the internal clock from the first clock VR02OUT from the ring oscillator 31 to the second clock VX from the external oscillator 40 when a current count value furnished by the second 2-bit counter 50 reaches 3. The other structure of the oscillating circuitry of the third embodiment is the same as that of the first embodiment as shown in FIG. 1 and that of the second embodiment as shown in FIG. 4, and therefore only a difference between the second and third embodiments will be explained.

When the integrated circuitry 1 is activated by turning its power on or the integrated circuitry 1 is reset, the second 2-bit counter 50 starts to count the number of pulses included in the second clock VX furnished by the external oscillator 40 and then furnish a current count value CNTb to the second equality circuit 51. When the current count value CNTb reaches 3, the second equality circuit 51 furnishes the control signal C at a logic high level for instructing the main body 32 of the internal clock selection circuit 41 to change the current selection of the internal clock from the first clock VR02OUT to the second clock VX. In response to the control signal C at a logic high level, the main body 32 of the internal clock selection circuit 41 stops the delivery of the first clock VR02OUT by turning off the first switch 47, and then furnishes a signal H held at a logic high level as the internal clock V0 by turning off the second switch 48. Simultaneously, in response to the control signal C, the first 2-bit counter 42 starts to count periods of the second clock VX and furnish the current count value CNT to the first equality circuit 43. When the current count value CNT reaches 3, the first equality circuit 43 causes the equality signal to make a LOW to HIGH transition. As a result, the selection of the internal clock is changed from the signal H held at a logic high level to the second clock VX. The other operation of the oscillating circuitry of the second embodiment of the present invention is the same as that of the first embodiment, and therefore the description about the other operation will be omitted hereafter.

As previously mentioned, the internal clock selection circuit 41 of the third embodiment is so constructed as to stop the delivery of the first clock VR02OUT and then furnish a signal held at a logic high level when it determines that the external oscillator 40 is generating the second clock VX properly, by means of the second 2-bit counter 50 and the second equality circuit 51, and, after that, to change the selection of the internal clock to the second clock VX after it counts predetermined periods of the second clock VX by resetting the first 2-bit counter 42. Accordingly, the CPU 33 does not need to perform settings for changing the current selection of the internal clock for both the internal clock selection circuit 41 and the external oscillator 40, and therefore the oscillating circuitry of this embodiment makes it possible to get the integrated circuitry 1 up and running smoothly with the simple switching operation mentioned above.

Furthermore, the internal clock selection circuit 41 of the third embodiment is so constructed as to determine whether the external oscillator 40 is generating the second clock VX properly and then disable the selection of the second clock VX when it determines that the external oscillator 40 is not generating the second clock VX properly, by means of the second 2-bit counter 50 and the second equality circuit 51. Accordingly, the oscillating circuitry of the third embodiment makes it possible to avoid a possibility that a wrong selection of the second clock is carried out and the signal H held at a high logic level remains being furnished as the internal clock, and hence the integrated circuitry 1 is terminated completely, for reasons that the external oscillator 40 does not start up completely, or there is an occurrence of an emergency such as the disconnection of the external components from the external terminals 2 and 3 of the external oscillator 40. Accordingly, the restoration of the integrated circuitry can be implemented surely after it is reset.

Like the first embodiment, the oscillating circuitry of the second embodiment can oscillate in either one of the two oscillating modes while preventing an increase in the number of pins needed by the integrated circuitry 1 and an increase in the size of the oscillating circuitry. Furthermore, even though the first and second clocks are out of phase with each other, neither a clock pulse having a repetition rate higher than those of the first and second clocks nor a spike noise can be generated. This results in ensuring the operation of latch circuits or the like built in the integrated circuitry. Therefore, the restoration of the integrated circuitry can be ensured after it is reset. In addition, the oscillating circuitry can change the selection of the internal clock to the second clock VX by writing data into the second register 35. The oscillating circuitry according to the first embodiment thus makes it possible to change the current selection to the second clock VX according to the operating status of the integrated circuitry 1 including the oscillating circuitry.

Many widely different embodiments of the present invention may be constructed without departing from the spirit and scope of the present invention. It should be understood that the present invention is not limited to the specific embodiments described in the specification, except as defined in the appended claims.

What is claimed is:

1. Oscillating circuitry which can be built in integrated circuitry and which can oscillate in either one of two or more oscillating modes, comprising:

an internal oscillator for generating a first clock;

an external oscillator capable of generating a second clock in either one of two oscillating modes which is determined according to external means connected to terminals thereof; and internal clock selection means which delivers the first clock as an internal clock to the integrated circuitry just after the integrated circuitry is activated or reset, stops the delivery of the first clock and simultaneously furnishes a signal held at a logic high level as the internal clock in response to a control signal for instructing a selection of the second clock, and then determines whether or not said external oscillator is generating the second clock properly, and which furnishes the second clock as the internal clock when it determines that said external oscillator is generating the second clock properly.

2. The oscillating circuitry according to claim 1, wherein said internal oscillator is a ring oscillator.

3. The oscillating circuitry according to claim 1, wherein said internal clock selection means further includes a register into which new contents can be rewritten by a writing operation, and which can generate the control signal having a value corresponding to the new contents.

4. The oscillating circuitry according to claim 1, wherein said internal clock selection means includes a counter, responsive to the control signal for instructing the selection of the second clock, for counting the number of pulses included in the second clock applied thereto, and means which, when the counter reaches a predetermined value which is greater than or equal to 1, determines that said external oscillator is generating the second clock properly and then furnishes the second clock as the internal clock.

5. The oscillating circuitry according to claim 1, wherein said internal clock selection means further comprises means for determining whether or not said external oscillator is generating the second clock properly, and for generating the control signal for instructing the selection of the second clock when it determines that said external oscillator is generating the second clock properly.

6. The oscillating circuitry according to claim 5, wherein said determining means includes a counter for counting the number of pulses included in the second clock applied thereto, and means for generating the control signal for instructing the selection of the second clock when the counter reaches a predetermined value which is greater than or equal to 1.

7. The oscillating circuitry according to claim 1, wherein said internal clock selection means further comprises means for determining whether or not said external oscillator is generating the second clock properly, and for disabling the selection of the second clock when it determines that said external oscillator is not generating the second clock properly.

8. The oscillating circuitry according to claim 7, wherein said disabling means includes a counter for counting the number of pulses included in the second clock applied thereto and for furnishing an overflow signal when the counter overflows, and wherein said internal clock selection means further includes a register into which new contents from outside can be rewritten by a writing operation, and which can generate the control signal for instructing the selection of the second clock according to the new contents only if it receives the overflow signal from said counter.

* * * * *